United States Patent [19]

Marshall

[11] 4,180,140

[45] Dec. 25, 1979

[54] LOUDSPEAKER PORTING

[75] Inventor: Neal H. Marshall, Bolton, Mass.

[73] Assignee: Bose Corporation, Framingham, Mass.

[21] Appl. No.: 938,404

[22] Filed: Aug. 31, 1978

[51] Int. Cl.[2] ........................ H05K 5/00; A47B 81/06

[52] U.S. Cl. .................................... 181/156; 181/147; 181/149; 181/199

[58] Field of Search ............... 181/156, 144, 147, 149, 181/150, 153, 155, 166, 175, 199; 179/1 E

[56] References Cited

U.S. PATENT DOCUMENTS

| | | | |
|---|---|---|---|
| 3,443,660 | 5/1969 | Virva et al. | 181/156 |
| 3,987,258 | 10/1976 | Tsutsui et al. | 181/149 |
| 4,071,111 | 1/1978 | Croup | 181/199 |

FOREIGN PATENT DOCUMENTS

| | | | |
|---|---|---|---|
| 109431 | 12/1939 | Australia | 181/158 |

*Primary Examiner*—Stephen J. Tomsky
*Attorney, Agent, or Firm*—Charles Hieken

[57] ABSTRACT

In a loudspeaker system having eight drivers on a baffle, the baffle has two port openings centered in respective squares embracing respective groups of four drivers. A tubular column extender snaps into each port opening and has a snap cap for detachably securing a polyester disk over the opening. A grill formed with two openings for accomodating the column extenders covers the drivers. A grill retainer formed with openings at each end for accomodating the column extenders abuts the grill, and clinch nuts screws on the threaded end of ach column extender to keep the grill retainer against the grill with the grill against the front baffle.

3 Claims, 10 Drawing Figures

LOUDSPEAKER PORTING

BACKGROUND OF THE INVENTION

The present invention relates in general to loudspeaker porting and more particularly concerns a novel loudspeaker system having all the advantages of the commercially available BOSE Model 800 loudspeaker system while reproducing low frequency sound at significant sound levels with reduced driving power with structure that is relatively free from complexity through the use of damping material in the port tube that may be readily changed with a structure that also helps keep the grill in place over the loudspeaker drivers. The present invention incorporates the principles in application Ser. No. 719,949 entitled LOUDSPEAKER SYSTEM of Joseph Veranth filed Sept. 2, 1976, now U.S. Pat. No. 4,146,744.

The present invention represents an advance over the commercially available BOSE 800 professional loudspeaker system that comprises eight high-compliance, full-range drivers connected in phase.

While that system performed well and reproduced sound at high sound levels without audible distortion, the driving power required to produce a given sound level in the bass frequency region was higher than desired. The aforesaid pending application teaches using two reactive air columns ports that function to reduce driver cone excursion at low frequencies and produce high output levels at deep bass frequencies with relatively little distortion and reducing the Q of the port mass-cabinet compliance resonance by placing damping material in each port tube. Although this invention works well, it was discovered that after prolonged use, there was a buzzing sound during heavy bass passages. It was discovered that the cause of this problem was clogging of the damping material. Accordingly, it is an important object of the invention to provide methods and means for overcoming the problem noted above.

It is a further object of the invention to achieve the preceding object with structure that facilitates maintaining a clean passage in the port tube damping means.

It is still a further object of the invention to achieve one or more of the preceding objects with structure that facilitates easy replacement of the damping means.

It is still a further object of the invention to achieve one or more of the preceding objects with structure that also helps detachably secure the grill to the baffle.

It is still another object of the invention to achieve one or more of the preceding objects with structure that may be readily assembled and disassembled without tools.

It is still another object of the invention to achieve one or more of the preceding objects with structure that is free from undesired sympathetic vibrations when reproducing sound at high levels.

It is still another object of the invention to achieve one or more of the preceding objects with attractive structure.

It is still another object of the invention to achieve one or more of the preceding objects with structure that is relatively easy and economical to manufacture.

SUMMARY OF THE INVENTION

According to the invention, in a loudspeaker system having a plurality of high-compliance drivers in a common cabinet, port tube means having a port tube mass that resonates with the cabinet compliance, and damping means in the port tube means for reducing the Q of the port tube mass and cabinet compliance, the improvement comprises means for detachably securing the damping means in the port tube means to facilitate replacement thereof when the damping means becomes clogged with dirt or dust. Preferably, the means for detachably securing includes a snap cap that snaps over an end of the port tube means for keeping the damping means covering the port tube opening, the damping means typically comprising a polyester disk. Preferably the port tube snaps into openings formed in the baffle of the loudspeaker cabinet, a grill formed with openings for accomodating the port tube means covers the baffle and is kept in place by means including grill retaining means formed with an open region for accomodating the port tube means and fastening means, such as a clinch nut, secured to the end of the port tube means for urging the grill retaining means to contact the grill and keep the grill against the baffle. Preferably the port tube means comprises two port tubes symmetrically located in the baffle with each centered substantially in a square embracing a respective group of drivers.

Numerous other features, objects and advantages of the invention will become apparent from the following specification when read in connection with the accompanying drawing in which:

DETAILED DESCRIPTION OF PREFERRED EMBODIMENTS

Figure 1:
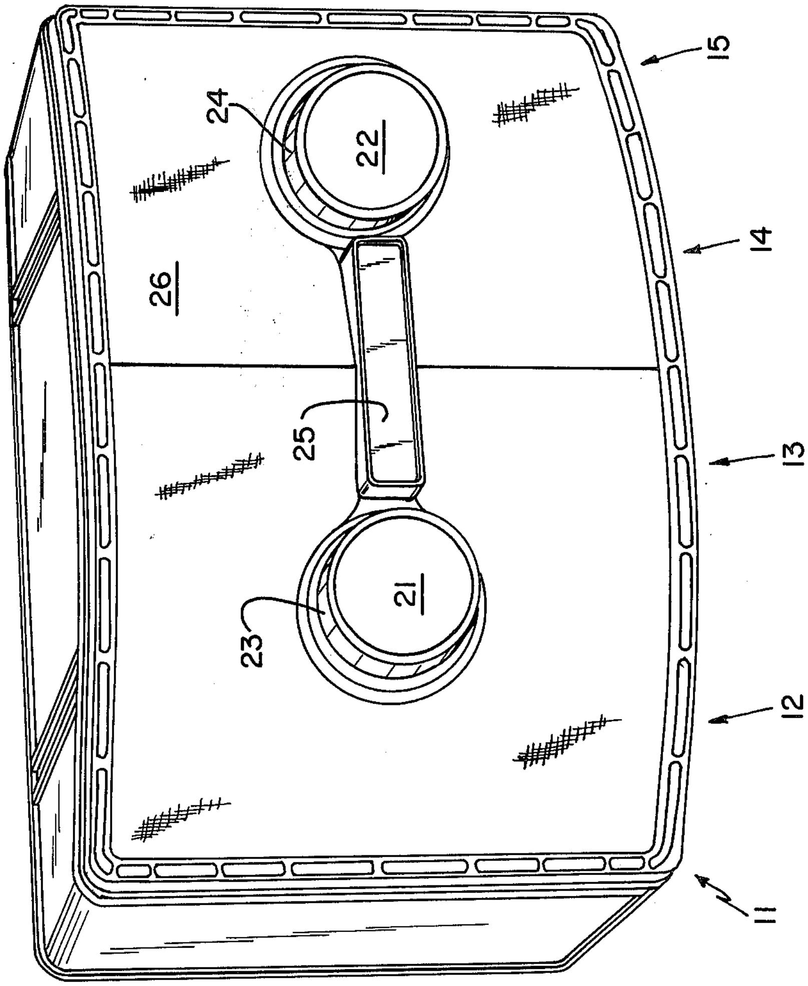
FIG. 1 is a perspective view of an embodiment of the invention.

With reference now to the drawing and more particularly FIG. 1 thereof, there is shown a perspective view of an embodiment of the invention in which loudspeaker cabinet 11 comprises a baffle having four vertical angled facets 12,13,14 and 15, each having two drivers thereon. Port tubes 21 and 22 are centered between facets 12 and 13 and 14 and 15, respectively, the exposed end of each port tube being threaded for accomodating clinch nuts 23 and 24, respectively, that abut the eye portions of grill retainer 25 to keep the latter against grill 26.

Referring to FIGS. 2–7, there is shown a pictorial representation helpful in understanding the steps involved in replacing the damping means when clogged while illustrating various structural features. The same reference symbols identify corresponding elements throughout the drawing.

Figure 2:
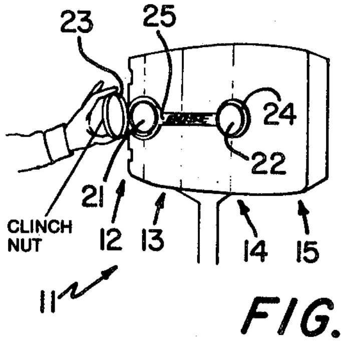
FIGS. 2–7 are diagramatic representations of the steps involved in replacing the damping means that also illustrate structural features of the invention.
Figure 3:
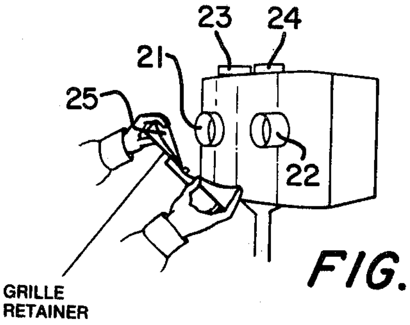
Figure 4:
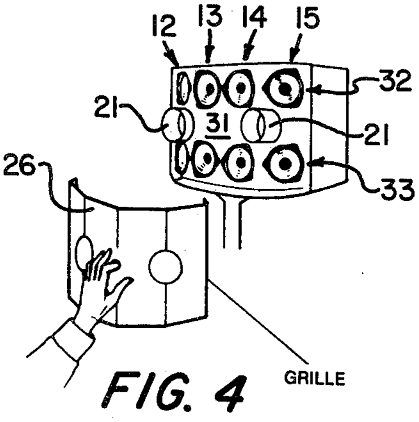

Referring to FIG. 2, there is illustrated the step of removing the clinch nuts, such as 23. Referring to FIG. 3, there is illustrated the step of removing the grill retainer 25. Referring to FIG. 4, there is shown the step of removing grill 26 which goes on baffle 31 and the eight nearly identical high compliance drivers such as described in U.S. Pat. No. 4,061,890 forming an upper row 32 and a lower row 33 with a driver in each row being on a respective one of the four facets 12–15.

Figure 5:
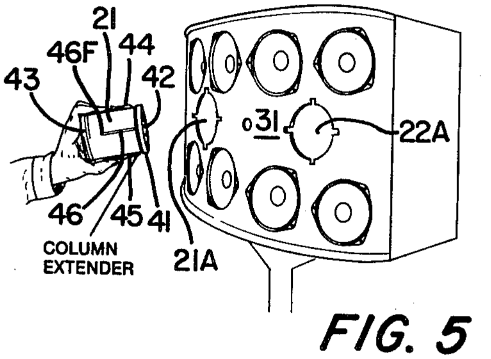

Referring to FIG. 5, there is illustrated the step of removing port 21 from opening 21A, port tube 22 already having been removed from opening 22A. FIG. 5 also illustrates the structure of port tube 21 having snap cap 41 covering polyester disk 42 and a threaded end 43 for accommodating clinch nut 23. Port tube 21 includes release tabs 44 and 45 that may be pressed while pulling gently on port tube 21 to remove it from port tube opening 22A.

Diametrically opposed ridges, such as 46 have a front edge 46F that engages the inside surface of baffle 31 to keep the port tube snapped in place. Ridges 46 and release tabs 44 and 45 mate with the four radial notches in space quadrature about openings 21A and 22A.

Figure 6:
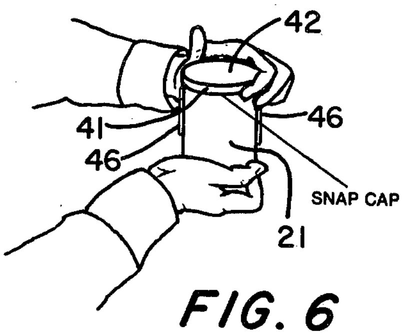

Referring to FIG. 6, there is shown the step of removing snap cap 41.

Figure 7:
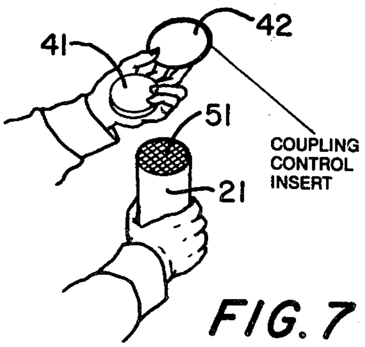

Referring to FIG. 7, there is shown polyester disk 42 removed. The inside ends of port tubes 21 and 22 are preferably covered with gauze scrim 55 attached to port tube grill 51, and they may now be washed by swishing them around in warm soapy water, then rinsed in clear water and allowed to air-dry thoroughly.

The polyester disk 42 may then be replaced over the port tube end, snap cap 41 clamped over it to keep it in place as shown in FIG. 6. Port tubes 21 and 22 may then be snapped into openings 21A and 22A, respectively, by pushing firmly until they snap into place. Grill 26 may then be positioned over port tubes 21 and 22 as shown in FIG. 4. Grill retainer 25 may then be positioned over port tubes 21 and 22 as shown in FIG. 3. Finally, clinch nuts 23 and 25 may be screwed to the ends of port tubes 21 and 22, respectively, as shown in FIG. 2 to complete the reassembly of the system.

Figure 10:
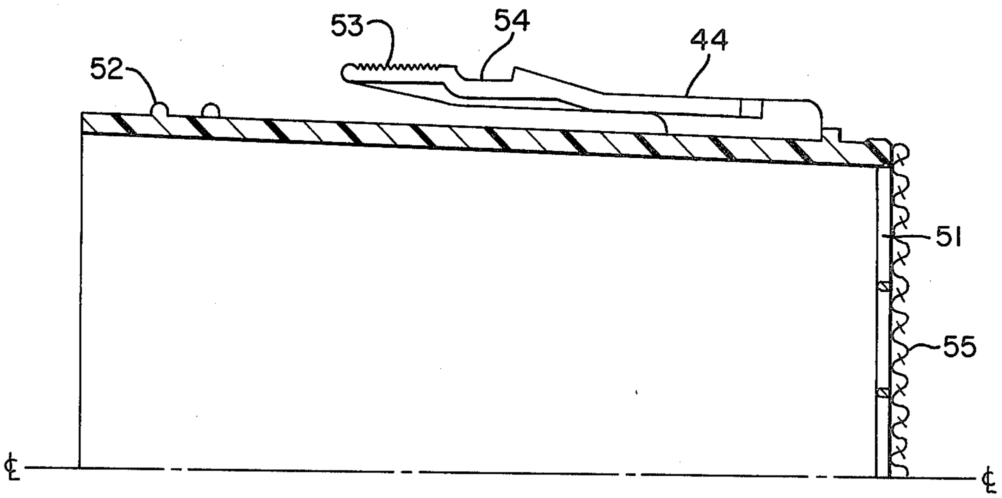
FIGS. 8–10 are side, end and half-sectional views respectively of a port tube.
Figure 8:
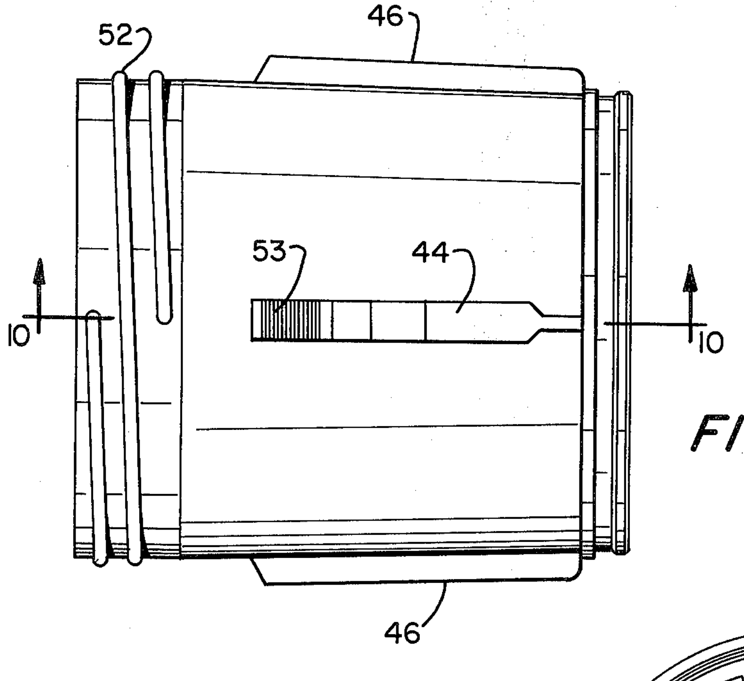
Figure 9:
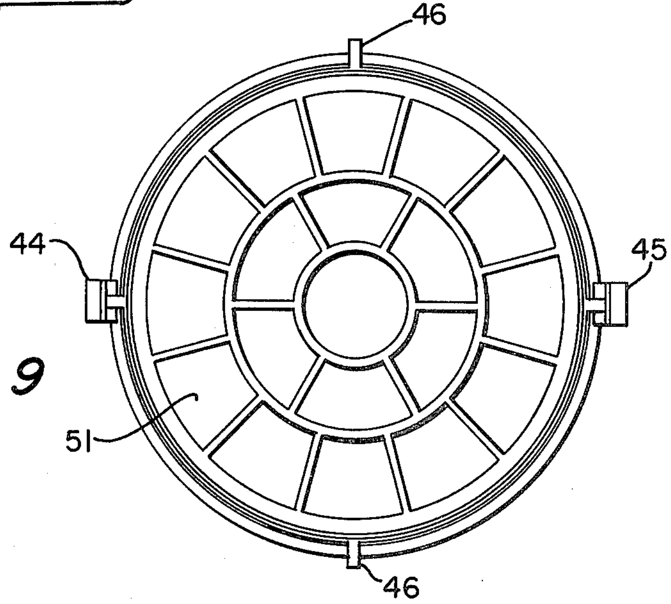

Referring to FIGS. 8–10, there are shown side, end and half-sectional views, respectively, of port tubes 21 and 22 helpful in better understanding the structure. Port tubes 21 and 22 may be molded of plastic material such as Borg Warner Grade DFA or equivalent. FIG. 8 shows two complete threads 52 for receiving clinch nuts, such as 23 and 24. The form of release tabs 44 and 45 is best seen in FIG. 10. Each release tab includes a ridged surface 53 for gripping and is formed wth a notch 54 for engagement with the baffle. Preferably, scrim 55 is bonded to port tube grill 51 and is stiff black porous gauze-like material such as Solar Textiles No. HC434 that coacts with polyester disc 42 to provide a portion of the desired damping while also performing a cosmetic function of presenting a black appearance to one looking into a port tube that blends with the black external color of the assembled cabinet.

There has been described novel apparatus and techniques for facilitating replacement of the damping disk. It is evident that those skilled in the art may now make numerous uses and modifications of and departures from the specific embodiments described herein without departing from the inventive concepts. Consequently, the invention is to be construed as embracing each and every novel feature and novel combination of features present in or possessed by the apparatus and techniques herein disclosed and limited solely by the spirit and scope of the appended claims.

What is claimed is:

1. In a ported loudspeaker system having a cabinet with a baffle plate supporting a plurality of high compliance loudspeaker drivers thereon with port tube means mounted in openings therein and having a port tube mass for resonating with the cabinet compliance and damping means in said port tube means for reducing the Q of the resonant system comprising the cabinet compliance and the port tube mass, the improvement comprising, means for detachably securing said damping means to said port tube means including snap cap means detachably securing said damping means over an end of said port tube means normally inside said cabinet, grill means adjacent said baffle plate for covering said loudspeaker drivers and formed with open area accommodating said port tube means, grill retaining means engaging said grill means to urge the latter towards said loudspeaker drivers covered thereby and formed with an open area for accommodating said port tube means, and fastening means engaging the end of said port tube means outside said cabinet and for urging said grill retaining means toward said grill means.

2. The improvement in accordance with claim 1 wherein said port tube means is formed with at least one threaded end and said fastening means comprises a clinch nut for threadingly engaging said threaded end.

3. The improvement in accordance with claim 2 wherein said port tube means comprises first and second port tubes each formed with a threaded end, and said fastening means comprises first and second clinch nuts for threadingly engaging respective threaded ends of said first and second port tubes.

* * * * *